(12) United States Patent
Stimson et al.

(10) Patent No.: US 6,297,595 B1
(45) Date of Patent: *Oct. 2, 2001

(54) METHOD AND APPARATUS FOR GENERATING A PLASMA

(75) Inventors: Bradley O. Stimson, San Jose; John Forster, San Francisco, both of CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/049,276

(22) Filed: Mar. 27, 1998

Related U.S. Application Data

(62) Division of application No. 08/559,345, filed on Nov. 15, 1995.

(51) Int. Cl.[7] ................................................. H01J 7/24
(52) U.S. Cl. ............................ 315/111.51; 315/111.21; 118/723
(58) Field of Search ........................ 315/111.51, 111.21, 315/111.41, 334, 248; 204/298.16, 298.37; 156/345; 118/723

(56) References Cited

U.S. PATENT DOCUMENTS

| | | | |
|---|---|---|---|
| 3,594,301 | 7/1971 | Bruch | 204/298 |
| 3,619,402 | 11/1971 | Wurm et al. | 204/298 |
| 3,763,031 | 10/1973 | Scow et al. | 204/298 |

(List continued on next page.)

FOREIGN PATENT DOCUMENTS

| | | |
|---|---|---|
| 1905058 | 8/1970 | (DE) . |
| 0520519 | 12/1992 | (EP) . |
| 0601595 | 12/1993 | (EP) . |

(List continued on next page.)

OTHER PUBLICATIONS

EP 97307864.5 Search Report dated Jul. 31, 1998.
International Search Report issued Sep. 8, 1998 in PCT/US98/09739.
European Search Report issued Aug. 22, 1997 in EP97303124.8.
U.S. application No. 08/586,423, filed May 14, 1997.
U.S. application No. 08/310,617, filed Sep. 30, 1992.

(List continued on next page.)

*Primary Examiner*—Haissa Philogene
(74) *Attorney, Agent, or Firm*—Konrad Raynes & Victor, LLP

(57) ABSTRACT

A method and apparatus for generating a plasma by inductively coupling electromagnetic energy into the plasma. In one embodiment, first and second antenna coils are disposed about the circumference of the plasma containment area. The first and second antenna coils are relatively spaced along the longitudinal axis of the plasma containment area. A current is generated in the first and second antenna coils. A phase shift regulating network establishes a difference between the phase of the current in the first antenna and the phase of the current in the second antenna. The phase difference corresponds to the phase difference required to launch a helicon wave in the plasma. In a second embodiment, a chamber shield is made of a conductive material and is coupled to the RF source such that the shield functions as an RF antenna. The shield may be coupled in series to a coil surrounding the shield to increase the resultant flux density.

25 Claims, 6 Drawing Sheets

U.S. PATENT DOCUMENTS

| | | | |
|---|---|---|---|
| 4,336,118 | 6/1982 | Patten et al. | 204/192 EC |
| 4,362,632 | 12/1982 | Jacob | 422/183.04 |
| 4,568,845 | 2/1986 | Uehara | 310/13 |
| 4,626,312 | 12/1986 | Tracy | 156/345 |
| 4,661,228 | 4/1987 | Mintz | 204/192.25 |
| 4,716,491 | 12/1987 | Ohno et al. | 361/230 |
| 4,792,732 | 12/1988 | O'Loughlin | 315/334 |
| 4,842,703 | 6/1989 | Class et al. | 204/192.12 |
| 4,844,775 | 7/1989 | Keeble | 156/643 |
| 4,865,712 | 9/1989 | Mintz | 204/298.16 |
| 4,871,421 | 10/1989 | Ogle et al. | 156/643 |
| 4,918,031 | 4/1990 | Flamm et al. | 438/695 |
| 4,925,542 | 5/1990 | Kidd | 204/192.31 |
| 4,941,915 | 7/1990 | Matsuoka et al. | 204/298.12 |
| 4,948,458 | 8/1990 | Ogle | 156/643 |
| 4,990,229 | 2/1991 | Campbell et al. | 204/298.06 |
| 4,999,096 | 3/1991 | Nihei et al. | 204/192.3 |
| 5,065,698 | 11/1991 | Koike | 118/719 |
| 5,091,049 | 2/1992 | Campbell et al. | 156/643 |
| 5,122,251 | 6/1992 | Campbell et al. | 204/298.06 |
| 5,135,629 | 8/1992 | Sawada et al. | 204/192.12 |
| 5,175,608 | 12/1992 | Nihei et al. | 257/751 |
| 5,178,738 | 1/1993 | Ishikawa et al. | 204/192.11 |
| 5,178,739 | 1/1993 | Barnes et al. | 204/192.12 |
| 5,206,516 | 4/1993 | Keller et al. | 250/492.2 |
| 5,225,740 | 7/1993 | Ohkawa | 315/111.41 |
| 5,231,334 | 7/1993 | Paranjpe | 315/111.21 |
| 5,234,529 * | 8/1993 | Johnson | 156/345 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coultas et al. | 156/345 |
| 5,312,717 | 5/1994 | Sachdev et al. | 430/313 |
| 5,346,578 | 9/1994 | Benzing et al. | 156/345 |
| 5,361,016 | 11/1994 | Ohkawa et al. | 315/111.41 |
| 5,366,585 * | 11/1994 | Robertson et al. | 156/643 |
| 5,366,590 | 11/1994 | Kadomura | 156/662 |
| 5,368,685 | 11/1994 | Kumihashi et al. | 156/643 |
| 5,397,962 | 3/1995 | Moslehi | 315/111.51 |
| 5,401,350 | 3/1995 | Patrick et al. | 156/345 |
| 5,404,079 | 4/1995 | Ohkuni et al. | 315/111.81 |
| 5,417,834 | 5/1995 | Latz | 204/298.11 |
| 5,418,431 | 5/1995 | Williamson et al. | 315/111.51 |
| 5,421,891 | 6/1995 | Campbell et al. | 118/723 R |
| 5,429,070 | 7/1995 | Campbell et al. | 118/723 R |
| 5,429,710 | 7/1995 | Akiba et al. | 216/17 |
| 5,429,995 | 7/1995 | Nishiyama et al. | 437/238 |
| 5,430,355 | 7/1995 | Paranjpe | 315/111.21 |
| 5,431,799 | 7/1995 | Mosely et al. | 204/298.06 |
| 5,434,353 | 7/1995 | Kraus | 174/15.6 |
| 5,464,518 | 11/1995 | Sieck et al. | 204/192.12 |
| 5,487,785 | 1/1996 | Horiike et al. | 118/723 E |
| 5,503,676 | 4/1996 | Shufflebotham et al. | 118/723 MR |
| 5,540,824 | 7/1996 | Yin et al. | 204/298.34 |
| 5,554,223 | 9/1996 | Imahashi | 118/723 I |
| 5,560,776 * | 10/1996 | Sugai et al. | 118/723 AN |
| 5,569,363 | 10/1996 | Bayer et al. | 204/192.32 |
| 5,573,595 | 11/1996 | Dible | 118/723 MP |
| 5,639,357 | 6/1997 | Xu | 204/192.3 |
| 5,690,781 | 11/1997 | Yoshida et al. | 156/345 |
| 5,690,795 | 11/1997 | Rosenstein et al. | 204/192.1 |
| 5,763,851 | 6/1998 | Forster et al. | 219/121.43 |
| 5,800,688 | 9/1998 | Lantsman et al. | 204/298.11 |

FOREIGN PATENT DOCUMENTS

| | | |
|---|---|---|
| 0607797 | 1/1994 | (EP) . |
| 0593924 | 4/1994 | (EP) . |
| 0727807 | 1/1996 | (EP) . |
| 0774886 | 5/1997 | (EP) . |
| 2162365 | 1/1986 | (GB) . |
| 2231197 | 11/1990 | (GB) . |
| 56 047562 | 4/1981 | (JP) . |
| 59 190363 | 10/1984 | (JP) . |
| 61 190070 | 8/1986 | (JP) . |
| 63 246814 | 10/1988 | (JP) . |
| 02 141575 | 5/1990 | (JP) . |
| 6232055 | 8/1994 | (JP) . |
| 6283470 | 10/1994 | (JP) . |
| 7176398 | 7/1995 | (JP) . |
| 7176399 | 7/1995 | (JP) . |
| 888190 | 4/1996 | (JP) . |
| 8153712 | 6/1996 | (JP) . |
| 8288259 | 11/1996 | (JP) . |
| 8001363 | 7/1980 | (WO) . |
| WO 8606923 | 11/1986 | (WO) . |
| 9207969 | 5/1992 | (WO) . |
| 9515672 | 6/1995 | (WO) . |

OTHER PUBLICATIONS

U.S. application No. 08/567,601, filed Jun. 2, 1995.

M. Yamashita, "Sputter Type High Frequency Ion Source for Ion Beam Deposition Apparatus," *Jap. J. Appl. Phys.*, vol. 26, pp. 721–727, 1987.

M. Yamashita, "Fundamental Characteristics of Built–in High Frequency Coil Type Sputtering Apparatus," *J. Vac. Sci. Technol.*, vol. A7, pp. 151–158, 1989.

S.M. Rossnagel et al., "Metal Ion Deposition from Ionized Magnetron Sputtering Discharge," *J. Vac. Sci. Technol.*, vol. B12, pp. 449–453, 1994.

S.M. Rossnagel et al., "Magnetron Sputter Deposition with High Levels of Metal Ionization," *Appl. Phys. Lett.*, vol. 63, pp. 3285–3287, 1993.

S.M. Rossnagel, et al., "Filling Dual Damascene Interconnect Structures with AlCu and Cu Using Ionized Magnetron Deposition," *J. Vac. Sci. Technol.*, vol. b13, pp. 125–129, 1995.

Y–W. Kim et al., "Directed Sputter Deposition of AlCu: Film Microstructure and Chemistry," *J. Vac. Sci. Technol.*, vol. A12, pp. 3169–3175, 1994.

J. Hopwood et al., "Mechanisms for Highly Ionized Magentron Sputtering," *J. Appl. Phys.*, vol. 78, pp. 758–765, 1995.

P. Kidd, "A Magnetically Confined and ECH Heated Plasma Machine for Coating and Ion Surface Modification Use," *J. Vac. Sci. Technol.*, vol. A9, pp. 466–473, 1991.

W.M. Holber, et al., "Copper Deposition by Electron Cyclotron Resonance Plasma," *J. Vac. Sci. Technol.*, vol. A11, pp. 2903–2910, 1993.

S.M. Rossnagel, "Directional and Ionized Sputter Deposition for Microelectronics Applications," *Proc. of 3rd ISSP (Tokyo)*, pp. 253–260, 1995.

M. Matsuoka et al., "Dense Plasma Production and Film Deposition by New High–Rate Sputtering Using an Electric Mirror," *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), Jul./Aug. 1994.

U.S. application No. 08/559,345, filed Nov. 15, 1995 (Atty. Dk. 938/PVD/DV).

* cited by examiner

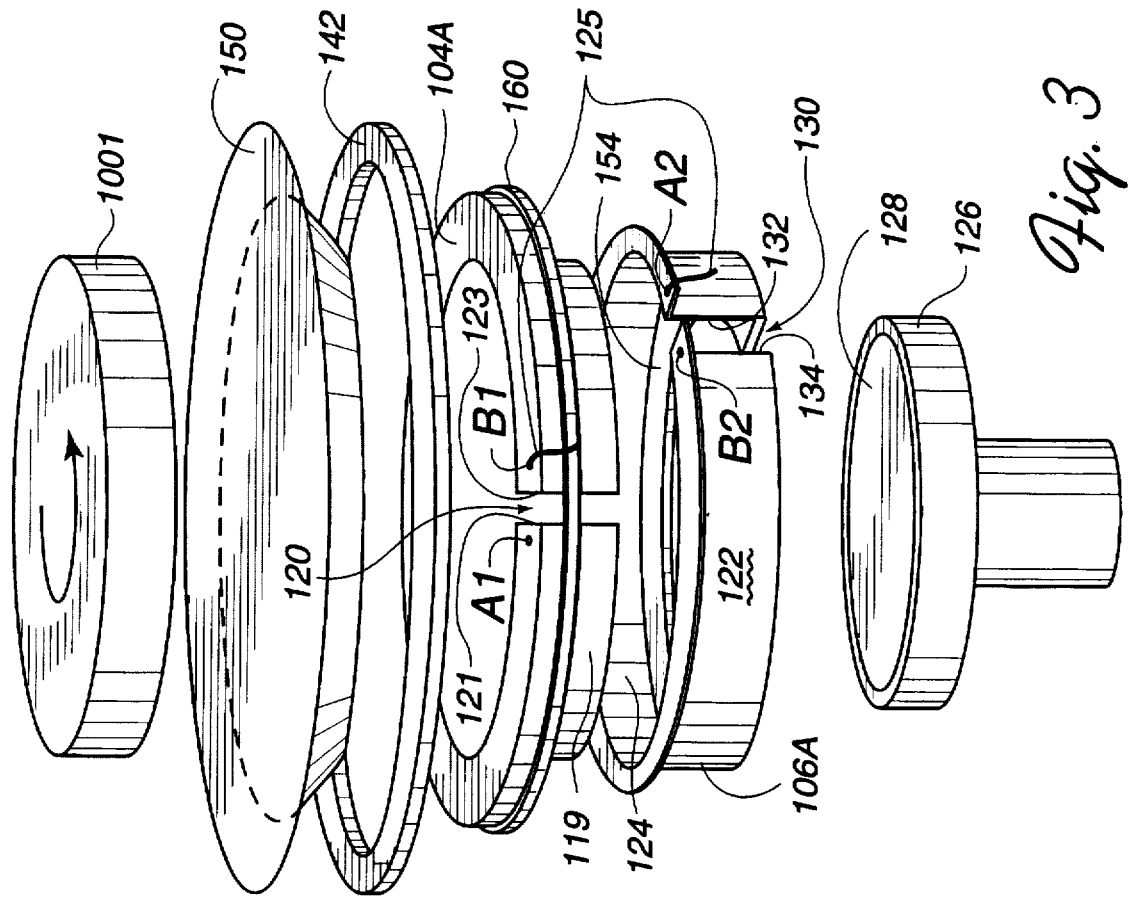
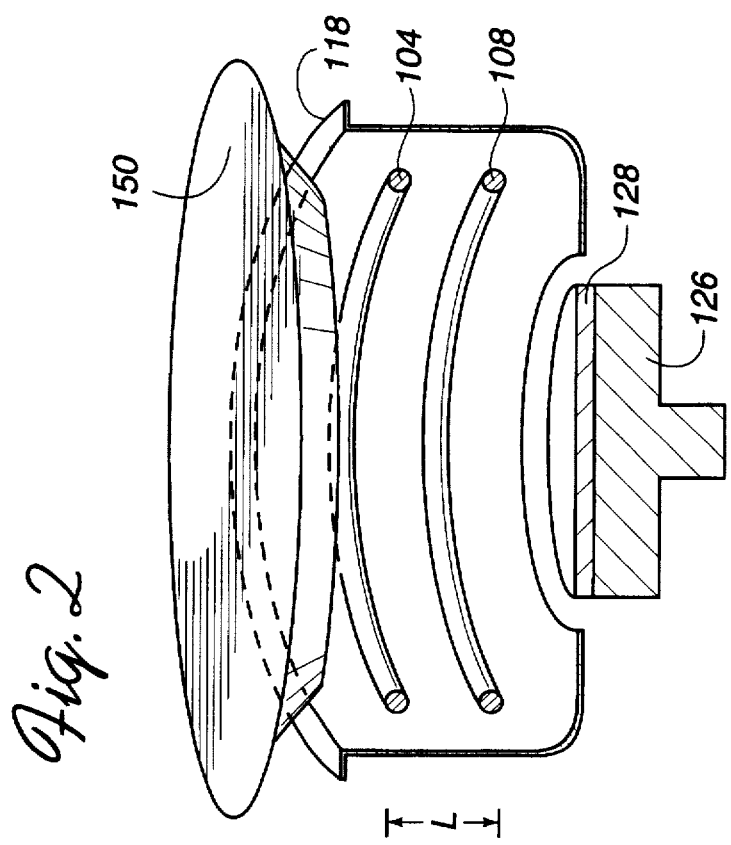

METHOD AND APPARATUS FOR GENERATING A PLASMA

This a division of application Ser. No. 08/559,345 filed on Nov. 15, 1995.

FIELD OF THE INVENTION

The present invention relates to plasma generators, and more particularly, to a method and apparatus for generating a plasma in the fabrication of semiconductor devices.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in the vicinity of a sputter target material which is negatively biased. Ions created within the plasma impact the surface of the target to dislodge, i.e., "sputter" material from the target. The sputtered materials are then transported and deposited on the surface of the semiconductor wafer.

Sputtered material has a tendency to travel in straight line paths from the target to the substrate being deposited at angles which are oblique to the surface of the substrate. As a consequence, materials deposited in etched trenches and holes of semiconductor devices having trenches or holes with a high depth to width aspect ratio, can bridge over causing undesirable cavities in the deposition layer. To prevent such cavities, the sputtered material can be "collimated" into substantially vertical paths between the target and the substrate by negatively charging the substrate and positioning appropriate vertically oriented collimating electric fields adjacent the substrate if the sputtered material is sufficiently ionized by the plasma. However, material sputtered by a low density plasma often has an ionization degree of less than 1% which is usually insufficient to avoid the formation of an excessive number of cavities. Accordingly, it is desirable to increase the density of the plasma to increase the ionization rate of the sputtered material in order to decrease the formation degree of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

This known apparatus for forming a plasma discharge suffers from various disadvantages. In particular, power absorption in the plasma is usually localized to a region just a few skindepths (typically a few cm) from the outside edge of the plasma such that the interior of the plasma generally absorbs substantially less power than the outer edge of the plasma. As a consequence, plasma excitation is nonuniform which may result in nonuniform etching or deposition.

It is recognized that in a conventional Inductively Coupled Plasma (ICP) generator using a helical coil, such as that shown in U.S. Pat. No. 4,362,632, the electromagnetic energy radiating from each turn of the coil antenna is in phase. Also, fields are coupled into the plasma in a substantially pure inductive mode. The density is usually limited to $\leq 10^{11}$ 14 $10^{12}$ cm$^{-3}$.

In contrast, a plasma excited using wave heating (helicon and ECR discharges) can be excited to densities as high as several $10^{13}$ cm$^{-3}$ and thus wave heating is preferred where a more dense plasma is required. Such helicon waves are absorbed much more uniformly throughout the discharge. Helicon waves can be excited in a weakly magnetized (typically B<500 gauss) plasma by means of a properly constructed antenna. In its simplest form, the helicon m =0 mode can be excited by two coil windings where the currents in each winding are in opposite directions.

An example of a known apparatus for utilizing helicon waves to generate plasmas of high density is shown in U.S. Pat. No. 4,990,229 to Campbell et al. U.S. Pat. No. 4,990,229 teaches that the efficient generation of plasmas depends strongly on the antenna configuration used. In other words, to maximize helicon wave coupling, a very specific and sometimes complex and large antenna configuration is often necessary. FIG. 2 of U.S. Pat. No. 4,990,229 depicts a two loop antenna used to excite the m=0 helicon mode. It is believed that the distance between the two loops is adjusted to match the m=0 helicon dispersion relation, i.e., $$\left[\frac{e\mu_0 n_0 \omega}{B_0 k_z^2}\right]^2 = \left[\frac{\omega}{\omega_c} \frac{\omega_p^2}{c^2 k_z^2}\right]^2 = 1 + (3.83/k_z a)^2; \quad L = \pi/k_z \quad (1)$$

where e is the charge of an electron;

$\mu_o$ is the permittivity;

$\omega_c$ is the electron cyclotron frequency ($eB_o m_e$);

$\omega_p$ is the plasma frequency $$\sqrt{\frac{e^2 n_0}{\varepsilon_0 m_e}};$$

$m_e$ is the mass of an electron;

$k_z = 2\pi/\lambda_z$ is the wavenumber in axial direction;

a is the radius of the plasma;

L is the distance between the loops;

$n_o$ is the plasma density, $\omega = 2\pi f$ is the excitation angular frequency;

$B_o$ is the axial magnetic field; and $\epsilon_o$ is the permittivity of vacuum.

It is believed that for particular conditions ($\omega$, $n_o$, $B_o$, a) the distance L between the loops of the antenna for efficient coupling of the helicon wave is fixed by this dispersion relation. In the approximation of $k_z$<<3.83/a, equation (1) can be rewritten as:

$$\lambda_z = \frac{2\pi}{k_z} = \frac{3.83}{a} \frac{B_0}{e\mu_0 n_0 f}; \quad L = \frac{1}{2}\lambda_z \quad (2)$$

for typical conditions ($B_o/n_o$=5×10$^{-10}$, f=13.6 MHz, a=15 cm) one obtains $\lambda z$=75 cm. This means that the distance between the two loops is restricted to about 40 cm for efficient coupling of the m=0 helicon mode. This would lead to a reactor aspect ratio of about unity. For large size substrates like TFT glass or silicon wafers, this would lead to an inconveniently large reactor volume. Also, the target to wafer spacing would often result in being about the same as the chamber diameter which would make it more difficult to efficiently produce uniform films on a wafer.

Examples of other geometrically complex antenna structures required to establish the electromagnetic fields necessary to launch the helicon wave are illustrated in FIGS. 3 and 5 of U.S. Pat. No. 4,990,229. Such complex and often large geometries are believed necessary in such prior art systems because most other variables affecting helicon wavelength and coupling efficiency are fixed by other constraints. Antenna geometry is one of the few variables which may be somewhat more easily modified in order to establish an appropriate electromagnetic field. For realizing both efficient coupling of the wave energy to the electron gas, and flexible geometry, it would be desirable to have independent control over $k_z$ or $\lambda_z$.

U.S. Pat. No. 5,146,137 describes various devices for the generation of a plasma using helicon waves. These waves are generated in one device using four or more plate-like electrodes surrounding a quartz chamber containing the plasma. The electrodes are coupled to a voltage source through phase shifters to produce high frequency capacitively-coupled voltages having a phase rotation of 900°. In an alternative device, four or more toroid-shaped coils are coupled to voltage sources to inductively couple electromagnetic energy into the chamber. The electrodes and coils of this reference also appear to be relatively complex.

In a number of deposition chambers such as a physical vapor deposition chamber, the chamber walls are often formed of a conductive metal such as stainless steel. Because of the conductivity of the chamber walls, it is often necessary to place the antenna coils or electrodes within the chamber itself because the conducting chamber walls would block or substantially attenuate the electromagnetic energy radiating from the antenna. As a result, the coil may be directly exposed to the deposition flux and energetic plasma particles. This is a potential source of contamination of the film deposited on the wafer, and is undesirable. To protect the coils, shields can be made from nonconducting materials, such as ceramics. However, many deposition processes involve deposition of conductive materials such as aluminum on the electronic device being fabricated. Because the conductive material will coat the ceramic shield, it will soon become conducting, thus again substantially attenuating penetration of electromagnetic radiation into the plasma.

SUMMARY OF THE PREFERRED EMBODIMENTS

It is an object of the present invention to provide an improved method and apparatus for generating plasmas within a chamber, obviating, for practical purposes, the above-mentioned limitations.

These and other objects and advantages are achieved by, in accordance with one aspect of the invention, a plasma generating apparatus which inductively couples electromagnetic energy into the magnetized plasma from a first antenna coil about the circumference of a plasma generation area, and inductively couples electromagnetic energy into the plasma from a second, separate antenna coil about the circumference of the plasma generation area, wherein the currents through (or voltages applied to) the first and second coils, have a predetermined phase difference, preferably between $\frac{1}{4}\pi$ to $1\frac{3}{4}\pi$. Under appropriate settings, this phase difference in the electromagnetic fields generated by the two antenna coils can launch a helicon wave in the magnetized plasma. Such an arrangement has a number of advantages. For example, and as described in greater detail below, this plasma generation apparatus permits the antennae design for the plasma generator to be substantially simplified and to have a substantially lower aspect ratio. More specifically it has been determined that the chamber shields themselves can be used as the antennae for the plasma generator, to thereby substantially simplify the design of the system.

In another aspect of the invention, the phase difference between the currents in the first and second coils can be electrically varied by, for example, a phase shifting network. As a consequence, the chamber can be better designed to optimize factors such as deposition efficiency, etch rate and deposition rate uniformity. The chamber design is not limited (as is the case for many prior art designs) by the requirement that spacing between loops in the antenna be approximately $\frac{1}{2}\lambda_z$ for a particular antennae design. For example, the height of the chamber can be substantially reduced even though such a reduction would affect the spacing between the coils. By electrically varying the phase difference between the coils, the phase difference necessary to launch a helicon wave of a particular wavelength is readily obtainable despite changes to the coil spacing. Thus, it is possible to launch a wave with a half wavelength substantially larger than the coil distance by decreasing the phase difference substantially below $\pi$.

In yet another aspect of the present invention, an RF antenna for generating a plasma in a chamber shield comprises a conductive shield coupled in series to a coil surrounding the shield. Such an arrangement has been found to substantially reduce attenuation of the RF power being coupled from the outer coil, through the conductive shield and into the chamber interior.

BRIEF DESCRIPTION OF THE DRAWINGS

FIG. 2 is a perspective, partial cross-sectional view of a PVD chamber in accordance with an embodiment of the invention in which two coil windings are installed within shields.

FIG. 3 is an exploded view of a PVD chamber utilizing the shields as coil windings.

DETAILED DESCRIPTION OF THE PREFERRED EMBODIMENTS

Figure 1:
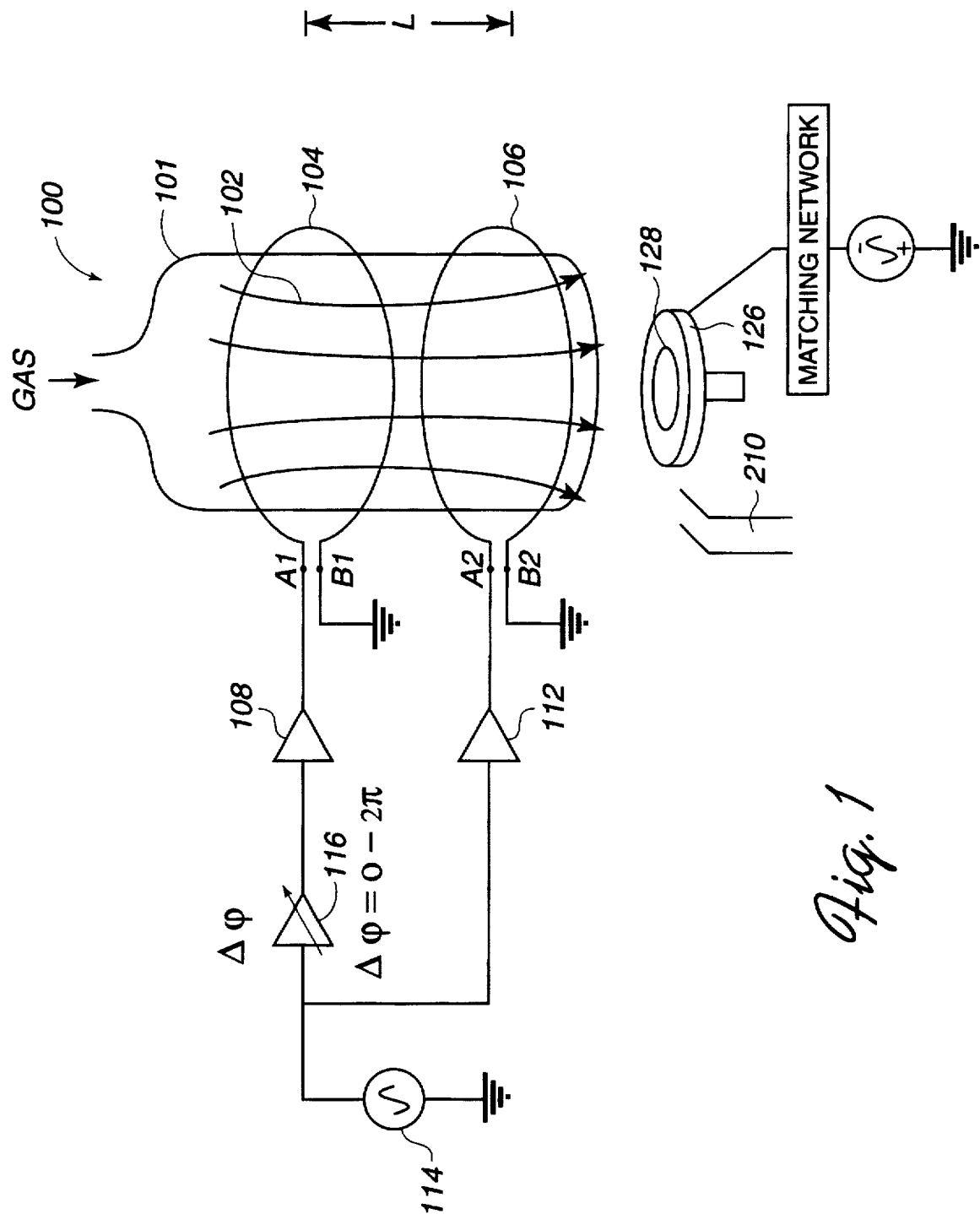
FIG. 1 is a schematic representation of a plasma generating apparatus in accordance with one embodiment of the present invention.

Embodiments of the present invention will be described hereinafter with reference to the drawings. Referring first to FIGS. 1 and 2, a plasma generator in accordance with a first embodiment of the invention comprises a substantially cylindrical plasma chamber 100 in a vacuum chamber 101 in which a substantially uniform, axially oriented magnetic field (as represented by magnetic lines of force 102) may be established through the plasma. Such a magnetic field may be generated by, for example, Helmholtz coils (not shown) coaxial with the chamber axis. At least two coaxial antenna coils 104 and 106 are arranged in spaced relationship around the circumference of the chamber 100. The two antenna coils 104 and 106 may be spaced apart by a distance "L" measured along the axis of the chamber 100. Each antenna coil comprises at least one substantially complete turn, and each antenna coil is capable of radiating electromagnetic energy.

The first antenna coil 104 is coupled to a first amplifier and matching network 108. The second antenna coil 106 is coupled to a second amplifier and matching network 112. The first and second RF amplifiers 108 and 112 are electrically coupled to a single RF generator 114. However, the first amplifier 108 is coupled to the generator 114 through a phase shift regulating network 116 which permits the current in the first antenna coil 104 and the current in the second antenna coil 106 to be phase shifted relative to one another.

The vacuum chamber 101 is evacuated by a pump 210 before the plasma precursor gas is admitted into the chamber. A helicon wave may be launched by magnetizing the plasma, and establishing an appropriate phase difference between the first antenna coil 104 and the second antenna coil 106 until desired conditions are met. For example, in the embodiment shown in FIG. 2, it may be desirable to launch a helicon wave within the chamber 100 having a wavelength $\lambda$ equal to four times the distance L between the first antenna coil 104 and the second antenna coil 106. Such a helicon wave may be efficiently launched by establishing a phase difference of $\pi/2$ between the currents through (or the voltage applied to) the coils.

In general, for two coils spaced a distance L apart and a desired wavelength of $\lambda_2$, the phase difference $\Delta\phi$ is preferably assigned as follows:

$$\Delta\phi = L/\lambda_2 2\pi.$$

It will therefore be seen that for a particular spacing L between the first antenna coil 104 and the second antenna coil 106, a plasma generator in accordance with one aspect of the present invention allows the phase difference to be adjusted so that the radiation emitted from the first and second antenna coils is suitable for launching a helicon wave of wavelength A. In other words, the phase shift regulating network 116 of plasma generator enables the wavelength to be appropriately adjusted or "tuned" electronically by the phase difference for any particular geometric configuration or spacing of the antenna coils. As a result, the plasma generator provides a greater degree of flexibility in plasma chamber hardware design, and in particular in the geometric design and placement of the antenna coils. In accordance with these aspects of the present invention, launching of an efficient helicon wave is not primarily dependant upon the geometry and positioning of the antenna coils. Consequently, the helicon wavelength and the plasma chamber hardware may be optimized for other factors (such as, for example, frequency, plasma properties, chamber size, and magnetic field) and the phase difference may be tuned electronically to adjust the wavelength independent of coil distance.

As shown in FIG. 2, the chamber 100 includes a shield 118 positioned between the coils 104 and 106 and the walls (not shown) of the chamber 100 which protect the chamber walls from the material being sputtered from a target 150 onto a semiconductor wafer 128. However, because the coils are exposed to the deposition flux and the energetic particles of the plasma, the coils can become a source of contamination of the film being deposited onto the wafer 128. To protect the coils as well as the chamber walls, a shielding structure can be positioned between the coils and the plasma instead of between the coils and the chamber walls. The antennae shielding structure may have two or more cylindrical metallic rings positioned within the plasma chamber. The portion of the shield adjacent to the antennae may include one or more slots to permit the electromagnetic energy radiated by the antennae to pass through the shield to the interior of the chamber to energize the plasma. These shields perform the function of protecting the antenna and walls of the plasma chamber from metal deposition during sputtering or other deposition processes.

A plasma generator in accordance with one aspect of the present invention allows the geometry of the antenna structure to be simplified to such an extent that the shields may themselves be used as antenna coils, thus performing a dual function. Furthermore, the slots previously required for energy propagation through the shield can be largely eliminated as well, thereby substantially simplifying the design of the shields. For example, a shield may be formed into an antenna coil in accordance with the present invention merely by providing a single slot or discontinuity in the circumference of the shield, thereby establishing a gap in what would otherwise be a closed metallic ring. Such a cylindrical shield with a slot in the circumference thereof forms an open loop with two distinct ends. Leads are then attached from the amplifier and the ground strap to respective ends of the loop, and an antenna coil is thereby formed.

Figure 4:
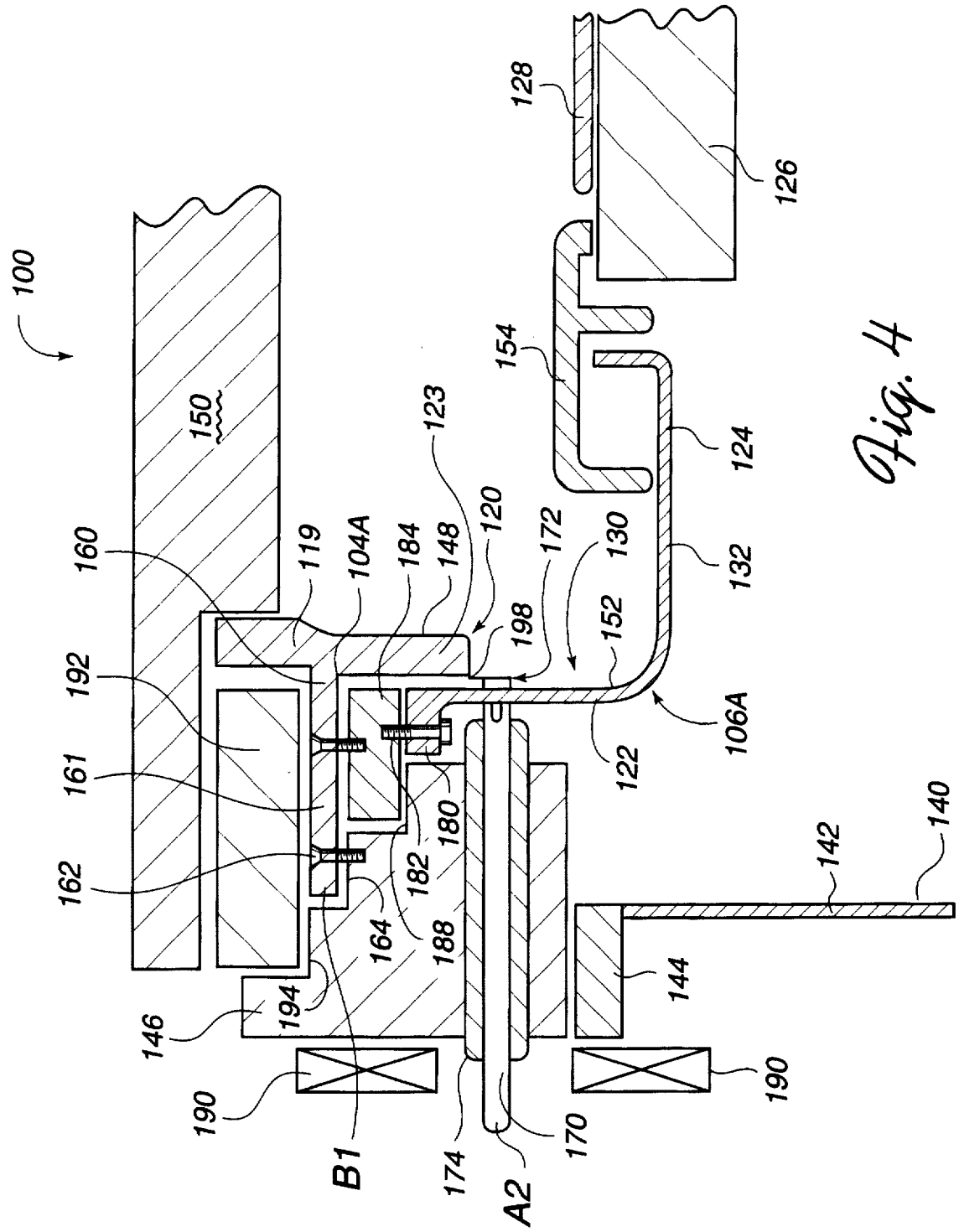
FIG. 4 is a cross-sectional view of the PVD chamber of FIG. 3. shown installed in a vacuum chamber.

Referring now to FIGS. 3–4, a plasma chamber 100A in accordance with an alternative embodiment 6f the present invention is illustrated. As shown therein, the upper coil 104A of this embodiment has a generally cylindrical shaped-wall 119 which forms a continuous closed metallic shield ring except for a single vertical slot 120 which is formed between two spaced ends 121, 123 of the coil-shield 104A. The output of the RF generator 114 (FIG. 1) is coupled via the phase regulating network 116 and the matching circuit 108 (FIG. 1) to a connection point A1 on end 121 of the slot 120 of the coil-shield 104A. A connection point B1 at the other end 123 of the slot 120 is connected by a ground strap 125 (FIG. 3) to ground (either directly or through a capacitor). The coil-shield 104A acts as both an antenna to radiate RF energy from the RF generator into the interior of the plasma chamber 100A and also as a shield to protect the interior of the deposition chamber from the material being deposited.

The second, lower coil-shield 106A is generally bowl-shaped and includes a generally cylindrically shaped, vertically oriented wall 122 and a generally annular shaped floor wall 124 (FIG. 4) which surrounds a chuck 126 which supports an item such as the wafer 128, for example. The coil-shield 106A also has a single slot 130 which separates two ends 132, 134 of the lower coil-shield 106. The coil-shield 106A has two connection points, A2, B2 at the two ends 132, 134, respectively, which are coupled in a manner similar to that of the first coil-shield 104A to the output of the corresponding matching circuit 112 and to ground, respectively.

FIG. 4 shows the plasma chamber 100A installed in a vacuum chamber 140 of a PVD (physical vapor deposition) system. Although the plasma generator of the present invention is described in connection with a PVD system for illustration purposes, it should be appreciated that a plasma generator in accordance with the present invention is suitable for use with all other semiconductor fabrication processes utilizing a plasma including plasma etch, chemical vapor deposition (CVD) and various surface treatment processes.

The vacuum chamber 140 includes a chamber wall 142 which has an upper annular flange 144. The plasma chamber 100A is supported by an adapter ring 146 which engages the vacuum chamber wall flange 144. The upper coil-shield wall 119 defines a surface 148 facing the interior of the plasma chamber 100A. Sputtered deposition material from a target 150 is deposited on the wafer 128 as intended but is also deposited on the interior surface 148 of the coil-shield 104A as well. The vertical wall 122 and the floor wall 124 of the lower coil-shield 106A similarly have interior surfaces 152 which also receive deposited materials sputtered from the target 150. A clamp ring 154 clamps the wafer to the chuck and covers the gap between the lower coil-shield 106 and the chuck 126. Thus, it is apparent from FIG. 4 that the coil-shields 104A and 106A together with the clamp ring 154 protect the interior of the vacuum chamber 140 from the deposition materials being deposited on the wafer 128 in the plasma chamber 100A.

The upper coil-shield 104A has a horizontally extending outer flange member 160 which is fastened by a plurality of fastener screws 162 to a ceramic ring 184 resting on the adapter ring 146. At one end 119 of the shield the coil-shield is grounded through a short strap 161 to the adapter ring 146 (as shown in FIG. 4). The other end (121, FIG. 2) is coupled to the RF amplifier and matching circuit 108 through a ceramic feed through (not shown).

In the embodiment illustrated in FIG. 4, the slots 120 and 130 of the coil-shields 104A and 106A, respectively, are at approximately the same azimuthal angle. The cross-sectional view of FIG. 4 also depicts the end 132 of the coil-shield 106A defining one side of the slot 130. Accordingly, the end 132 of the coil-shield 106A depicted in FIG. 4 provides the connection point A2 to the coil-shield 106A. The connection point A2 includes an RF feedthrough 170 which passes through the adapter ring 146 and is coupled to the end 132 of the coil-shield 106A at 172 as depicted in FIG. 4. The RF feedthrough 170 is electrically isolated from the adapter ring 146 by an isolation tube 174 of insulative material such as ceramic. The connection point A1 (not shown in FIG. 4) between the RF generator 114 (via the phase shift network 116 and the matching circuit 108, FIG. 1) to the first coil-shield 104A is likewise constructed with an RF feedthrough similar to the RF feedthrough 170 for the connection point A2.

The lower coil-shield 106A includes an upper flange 180 which is fastened by a plurality of fastener screws 182 to the isolator ring 184. The isolator ring 184 isolates the lower coil-shield 106A from the upper coil-shield 104A and also the adapter ring 146. The adapter ring 146 has a shelf 188 which supports the isolator ring 184 which in turn supports both the upper coil-shield 104A and the lower coil-shield 106A.

A Helmholtz coil 190 around the exterior of the vacuum chamber 140 provides the magnetic field through the plasma chamber 100A. The target 150 is supported by an isolator ring 192 which is received within a groove formed by a shelf 194 of the adapter ring 146 and an upper surface of the flange member 160 of the upper coil-shield 104A. The isolator ring 192 isolates the target 150 from the adapter ring 146 and the upper coil-shield 104A. Target, adapter and ceramic ring 192 are provided with O-ring sealing surfaces to provide a vacuum tight assembly from chamber flange 144 target 150.

As best seen in FIG. 4, the upper coil-shield 104A and the lower coil-shield 106A are overlapping in he axial direction but are spaced to define a gap 198 through which plasma precursor gases are admitted into the interior of the plasma chamber 100A. RF energy from the RF generator 114 (FIG. 1) is radiated from the coil-shields 104A and 106A. The RF energy radiated by the coil-shield 104A into the interior of the plasma chamber 100A is phase shifted by a predetermined amount from the RF energy radiated by the lower coil-shield 106A such that a helicon wave is launched and maintained in the plasma chamber 100A. Because of the helicon wave, the energy distribution of the plasma is more uniform and the density of the plasma is increased. As a consequence, the plasma ion flux striking the target 150 or semiconductor wafer 128 is higher and is more uniformly distributed such that the target material ejected from the target 150 is deposited faster and more uniformly on the wafer material 128. The higher plasma density will be beneficial in ionizing sputtered material from the target. As a result, the sputtered material will be more responsive to the collimating electric fields (not shown) adjacent to the wafer 128, which causes the perpendicularity of the metal flux to the wafer 128 to be significantly enhanced. Consequently, fine features may be coated more uniformly, and high aspect ratio holes and trenches may be filled with little or no void formation. Collimating electric fields may be induced by electrically biasing the wafer and/or pedestal negatively with respect to the plasma with an RF supply 151 (FIG. 1) to impose an HF RF signal (e.g., 13.6 Hz) to the pedestal through a matching network. These techniques are known to those skilled in the art.

In the embodiment illustrated in FIG. 3, a magnet structure 1001 is located behind the target. This magnet serves to determine the erosion profile on the target and can be optimized to give uniform film thickness on the wafer 128. The magnet structure 1001 may have one of several configurations designed to provide a desired erosion profile on the target. In each instance, the structure 1001 may include one or more magnets which are moved across the back side of the target during sputtering. It should be realized that if no RF power is applied to the coil-shields and only DC negative bias to the target 150, the chamber 100A closely resembles a conventional PVD chamber such as those currently installed on Endura PVD systems manufactured by Applied Materials, Inc., the assignee of the present application.

It is also noted that in the embodiment illustrated in FIG. 1, only a single phase shift regulating network is illustrated in combination with a pair of antennas and a single RF generator. In alternative embodiments of the present invention more than one phase shifter may be used, and correspondingly more than two antenna coils and associated amplifiers may also be used.

It is seen from the above that a plasma generator in accordance with one preferred embodiment of the present invention can substantially simplify the design of a deposition or other processing chamber which generates high density plasmas. By utilizing the shields of the chamber as the antenna coils of the RF generator, the need for a separate antenna structure and associated isolator members can be eliminated.

Still further, because the requirements for a particular size and shape for the antenna can be substantially relaxed, the chamber can be very compact. As shown in FIG. 4, the upper coil-shield 104 and the lower coil-shield 106 are very closely spaced and even overlap in the axial direction.

Notwithstanding this very close spacing, by properly selecting the phase difference between the currents generated in the coil-shields 104 and 106, a helicon wave may be launched having a wavelength $\lambda$ as determined by the frequency of the RF generator 114 and the phase difference.

In the illustrated embodiment, the chamber wall 142 has a width (measured in the radial direction) of 16" but it is anticipated that good results can be obtained with a width in the range of 6"–25". The wafer to target space is preferably about 2" but can range from about 1.5" to 8". The frequency of the generator 114 is preferably 13.6 MHz but it is anticipated that the range can vary from, for example, 1 MHz to 100 MHz. A variety of precursor gases may be utilized to generate the plasma including Ar, $H_2$, $O_2$ or reactive gases such as $NF_3$, $CF_4$ and many others. Various precursor gas pressures are suitable including pressures of 0.1–50 mT. For ionized PVD, a pressure around 10–20 mT is preferred for best ionization of sputtered material. Similarly, the strength of the magnetic field may vary from 20 to 1000 gauss but a field strength of about 200–500 gauss is preferred. The phase shift should be adjusted to optimize helicon wave coupling but generally is in the range of $\frac{1}{4}\pi$ to $1\frac{3}{4}\pi$ for optimum performance.

Figure 6:
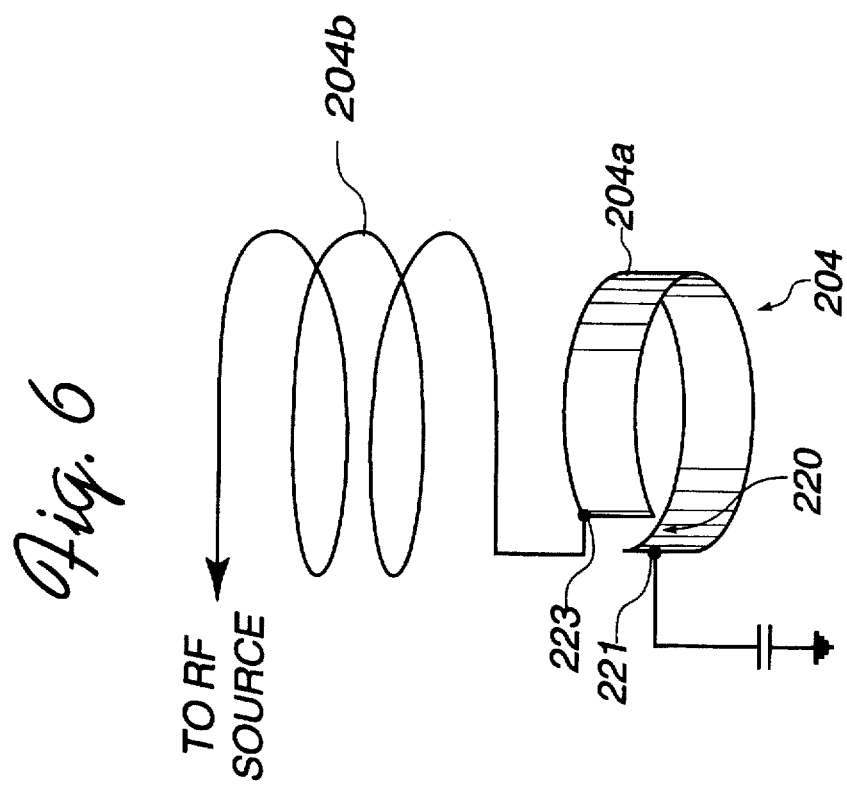
FIG. 6 is a schematic electrical representation of an antennae of FIG. 5.

The coil-shields may be fabricated from a variety of conductive materials including aluminum and stainless steel. Although the slots 120 and 130 are shown as being approximately aligned at the same azimuthal angle in FIGS. 3 and 6, the slots of the coil-shields need not be aligned but may be at any angle relative to each other as indicated in FIG. 3.

The coils 104, 106 and 104a and 106a of the illustrated embodiments described to this point are each depicted as a single turn coil. However, it should be appreciated that each coil may be implemented with multiple turn coils. Because the flux induced by coils is proportional to the square of the number of turns of the coil, it may be advantageous to increase the number of turns of the coil. In accordance with yet another aspect of the present invention, a coil-shield may be coupled in series with a helical coil such that the coil-shield is one turn of an RF antenna coil having a plurality of turns.

Figure 5:
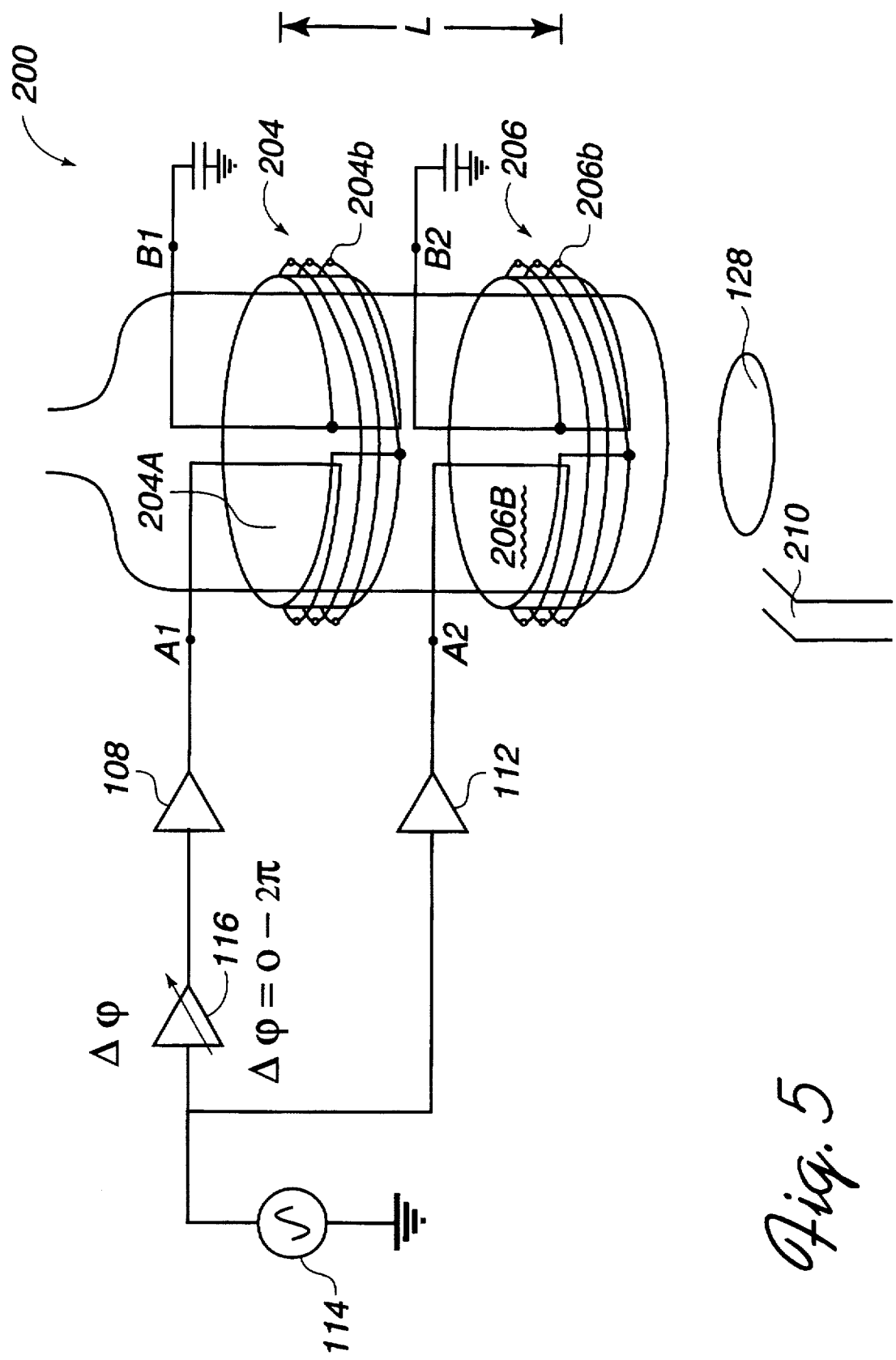
FIG. 5 is a schematic representation of a plasma generating apparatus in accordance with another embodiment of the present invention in which each antenna comprises a coil-shield coupled in series with another coil.

FIG. 5 shows a plasma generator in accordance with another embodiment of the present invention which is similar to the plasma generator of FIG. 1 except that the coaxial antenna coils 204 and 206 each comprise a coil-shield electrically connected in series to a multi-turn helical coil which surrounds the associated coil-shield. This arrangement may be more readily understood by reference to FIG. 6 which shows a schematic representation of the electrical connections of the coil 204 which includes a coil-shield 204a which is connected to a multi-turn helical coil 204b. One end of the helical coil 204b is coupled to an RF source such as the output of the first amplifier and matching network 108 (FIG. 5), the input of which is coupled to the RF generator 114 through the phase shift regulating network 116. The coil-shield 204a, like the coil-shield 104 of FIG. 3, has a slot 220 which defines two ends 221 and 223. The helical coil 204b is connected to the coil-shield 204a at end 223 of the coil-shield coil 204a. The other end 221 of the coil-shield 204a is coupled to ground, preferably through a capacitor. As best seen in FIG. 5, the helical coil 204b when installed is positioned to surround the coil-shield 204a. The turns of the helical coil 204b are wound around but insulatively spaced from the coil-shield 204a so that the current circulating through the helical coil 204b travels in the same circular direction as the current through the coil-shield 204a. Consequently, the magnetic fields induced by the helical coil 204b are in phase with the magnetic fields induced by the coil-shield 204a. The second coil 206 is similarly constructed of a coil-shield 206a coupled in series with a helical coil 206b which surrounds the coil-shield 206b. The turns of the helical coil 206b are likewise wound in phase with the turn of the coil-shield 206a.

Such an arrangement has been found to have a number of advantages. For example, it has been found that the RF power emanated by the helical coils are effectively coupled into the chamber through the associated coil-shields into the interior of the chamber. Any attenuation caused by the coil-shields is substantially reduced. At the same time, the coil-shields effectively protect the helical coils and other portions of the interior of the chamber from being coated or damaged by the various semiconductor processes including sputtering.

In addition, because each coil has a plurality of turns, the necessary power to produce a desired flux level in the chamber interior can be substantially reduced as compared to a single turn coil. High power levels may not be appropriate for some applications because of, for example, the added stress to components which can necessitate using components having a higher current carrying capacity.

An RF antenna comprising a series coupled coil-shield and coil in accordance with one aspect of the present invention may be used in semiconductor processing apparatus other than those requiring the launching of a helical wave in a high density plasma. For example, FIG. 7 illustrates a chamber 400 utilizing just one such RF antenna which has been found to generate a satisfactory high density plasma without the use of helicon waves.

The RF antenna for generating the high density plasma comprises a coil-shield 304a which is electrically coupled in series with a helical coil 304b which surrounds the coil-shield 304a. The coil-shield 304a is very similar to the coil-shield 104 of FIG. 4 except that the coil-shield 304a extends further down to a position below the top of the wafer (not shown) because in this embodiment, the chamber has only the one coil-shield, that is, coil-shield 304a. At the bottom of the coil-shield 304a is a horizontal annular lip 410 which terminates short of the clamp ring 154. Instead of a second coil-shield found in the earlier embodiments for launching helicon waves, the embodiment of FIG. 7 has a generally annular shaped grounded lower shield 420 which protects the chamber between the clamp ring 154 and the annular lip 410 of the coil-shield 304a. The lower shield 420 is spaced from the coil-shield 304a and is grounded to the chamber ground.

In the illustrated embodiment, the helical coil 304b is formed of a ribbon shaped copper wire which is wound in three helical turns surrounding the coil-shield 304a. The helical coil 304b is supported between an inner ceramic member 430 and an outer ceramic member 432 of a ceramic assembly 434. The ceramic assembly 434 insulates the helical coil 304b from the chamber and also from the coil-shield 304a. The lower shield 410 has a lip 440 which is received by the outer ceramic member 432 which supports the lower shield 420.

Figure 8:
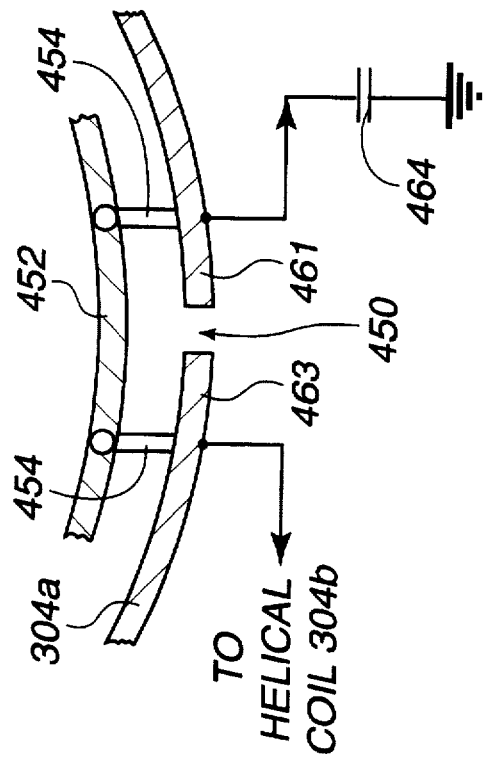
FIG. 8 is a cross-sectional view of the slot of the shield of FIG. 7 shown schematically with electrical connections.
Figure 7:
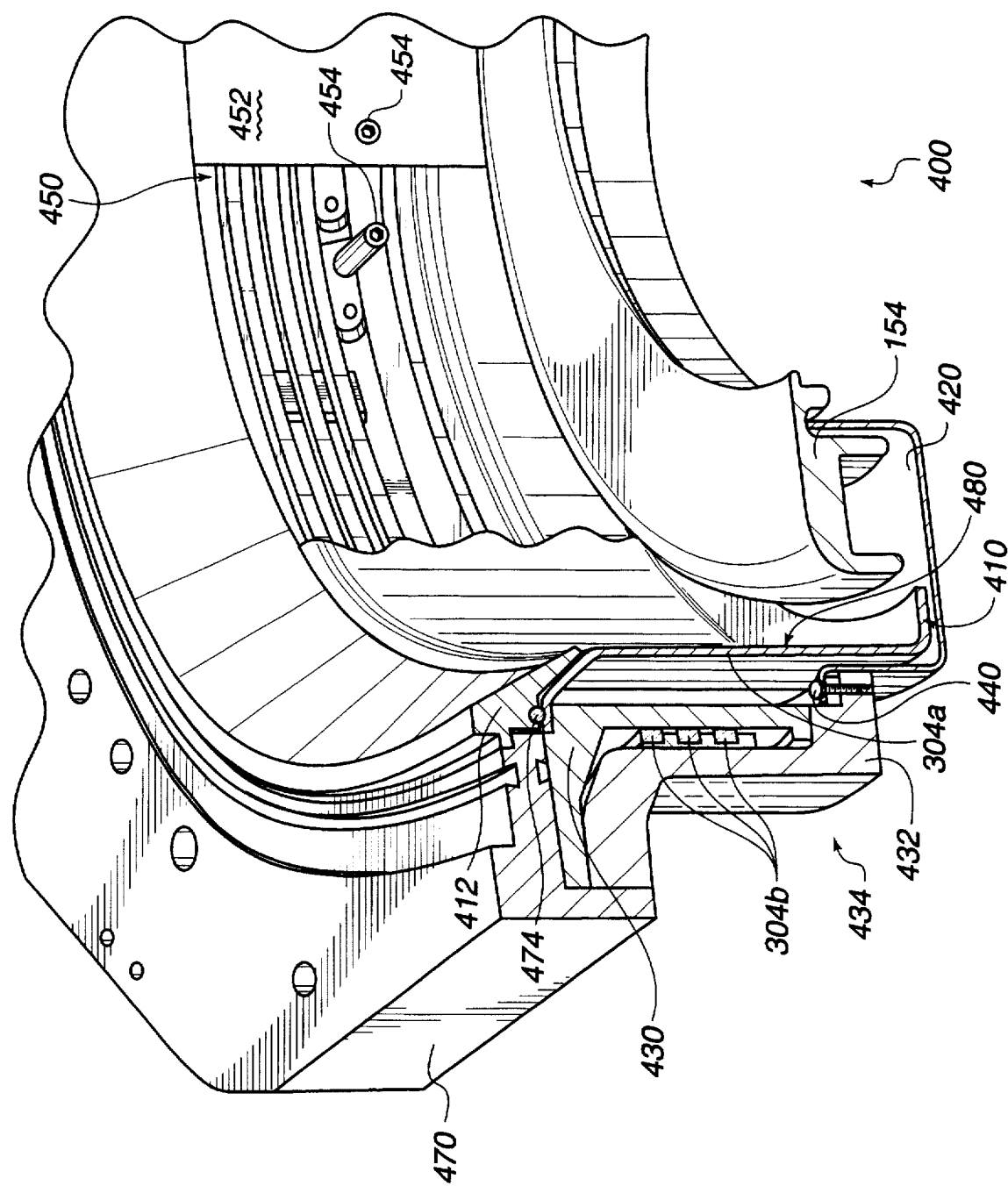
FIG. 7 is a perspective, partial cross-sectional view of a PVD chamber in accordance with another embodiment of the invention in which a coil is coupled in series with a shield.

In the embodiment of FIG. 8, the slot 450 separating the two ends of the coil-shield 304a is covered by a cover member 452 which is spaced from the coil-shield 304a by insulative ceramic standoffs 454 as best seen in FIG. 7. The cover member 452 shields the slot 450 from the material being sputtered. It is important to prevent sputtered material from passing through the slot or bridging across the slot to form a conductive path which could short the two ends of the slot together. The slots of the shields of the earlier described embodiments preferably have a similar cover member, either in front of or behind the associated slot. One end 461 of the coil-shield 304a is coupled to ground by a capacitor 464. The other end 463 of the coil-shield 304a is coupled to one end of the helical coil 304b as previously described. It is important that the coil-shield 304a be electrically coupled to the helical coil 304b in such a manner that current passing through the coil-shield 304a travels in the same circular direction as the current traveling through the helical coil 304b so that the magnetic fields of the coil-shield 304a and helical coil 304b are in phase.

The chamber 400 of the embodiment of FIG. 7 further includes a source adaptor member 470 which is coupled to chamber ground. A DC return ring 472 abuts the source adaptor ring 470 and is also coupled to ground. The coil-shield 304a is supported by the inner ceramic member 432 of the ceramic assembly 434 and is insulated from the DC return shield 472 and the source adaptor 470 by an insulating ring 474. As shown in FIG. 7, the coil-shield 304a is spaced from all conductive components to prevent undesirable arcing since the coil-shield is a part of the RF antenna emanating high RF energy to generate a high density plasma.

In another advantage of utilizing a coil-shield as part or all of the RF antenna for generating a plasma, it is believed that the RF potential applied to the coil-shield is capacitively coupled to the precursor gas to assist in initiating the generation of the plasma. However, it is recognized that the RF potential can also cause the coil-shield itself to be sputtered in addition to the target of the chamber. Accordingly, in order to prevent contamination of the wafer from material being sputtered from the coil-shield, it is preferred that the chamber be preconditioned by initiating sputtering of the target without the application of RF energy to the coil-shield and before the wafer is brought into the chamber for processing. In this manner, the target material can be sputtered and deposited onto the coil-shield to a sufficient thickness to prevent the underlying material of the coil-shield from being sputtered when the wafer is in the chamber.

Alternatively, if a target material is made of a conductive material and only one type of material is to be Sputtered, the coil-shield may be manufactured from the same material as the sputtered target.

In another aspect of the present invention, it has been recognized that sputtering of the coil-shield can also be reduced by choosing the circuit components such that a series resonance point is created at or near the center line 480 of the vertical wall of the coil-shield 304a. This resonance condition is preferably achieved by adjusting the capacitance of the capacitor 464 (FIG. 8) coupling one end 461 of the coil-shield 304a to ground. In a preferred embodiment, the capacitance of the capacitor 464 is empirically determined by measuring the voltages at the top and bottom of the wall of the coil-shield 304a while the capacitance of capacitor 464 is adjusted. Once the voltages at the top and bottom of the coil-shield 304a are substantially equal in magnitude but 180° out of phase, a resonance point, i.e., a point of minimum voltage potential will be created at the center 480 of the wall of the coil-shield 304a such that the center 480 will be maintainable at an RF ground. Such an arrangement minimizes the magnitudes of the voltages applied to the coil-shield 304a which is believed to correspondingly reduce sputtering of the coil-shield. For example, for an antennae having an inductance of approximate 4–5 micro henries at an RF frequency of approximately 4 Megahertz, a capacitance of approximately 0.025 micro farads is believed to be suitable. These values would of course vary, depending upon the particular geometries of the various components.

The coil-shield is preferably made of a highly conductive material such as stainless steel unless made of the same material as the sputtered target material as noted above. Other materials may also be used. The coil-shield material should however be a highly conductive material and one having a coefficient of thermal expansion which closely matches that of the material being sputtered to reduce flaking of sputtered material from the coil-shield onto the wafer.

In addition, for purposes of simplicity, the coil-shield 304a has been illustrated as a wall member having a generally flat annular shape except at the top and bottom sides of the shield wall. However, because of the relatively low aspect ratio of the coil-shield 304a and the helical coil 304b, it is anticipated that the magnetic field lines adjacent to the coil-shield 304a may have a curvature. Accordingly, it is anticipated that loss producing eddy currents in the coil-shield may be reduced and the performance of the system thereby improved by curving the wall of the coil-shield 304a to have a generally concave (i.e. inward curving) cross-section to more closely match the curvature of the field lines.

More specifically, the magnetic field is created by the current passing through the turns of the coil including the coil-shield. The total magnetic field at a particular point in the interior of the chamber is a function of the coil geometry including the aspect ratio (height to width) of the coil and the spacings of the coil turns. For a perfect solenoid, the magnetic field would be parallel to the center axis of the coil. However, because of the low aspect ratio of the coil of the illustrated embodiments, it is anticipated that the magnetic field lines may be somewhat curved adjacent to the shield-coil. Magnet field lines which intersect the conductive shield will produce eddy surface currents which in turn induce magnetic fields opposing to the intersecting field to in effect cancel at least a portion of the magnetic field intersecting the shield. Because the conductive shield has a resistance, the eddy currents consume power which produces losses.

This RF magnetic field induced in the chamber containing the precursor gas excites free electrons which collide with the atoms of the precursor gas to ionize the precursor gas. Electrons freed from the ionized precursor gas continue to collide with other atoms of the precursor gas setting up an avalanche condition which rapidly ionizes the precursor to create a dense plasma of free electrons and ionized gas.

The neutral atoms of the sputtered material which subsequently pass through the plasma are struck by the excited free electrons which ionize the sputtered material. As discussed above, it is desired to ionize as much of the sputtered material as possible to facilitate collimating the sputtered material. To efficiently generate the magnetic fields, losses due to eddy currents should be minimized. Hence, it is preferred to curve the coil-shields as appropriated match the curvature if any of the magnetic field lines to reduce undesirable eddy current losses.

The chamber 400 may be fabricated of materials and dimensions similar to those described above in connection with other embodiments, modified as appropriate for the particular application. The coil 304b of the illustrated embodiment is made of ⅜ by ⅛ inch heavy duty copper ribbon formed into a three turn helical coil. However, other highly conductive materials and shapes may be utilized. For example, hollow copper tubing may be utilized, particularly if water cooling is desired. The RF generators 114, matching circuits 108 and 112, phase regulating network 116 and adjustable capacitor 464 are components well known to those skilled in the art. For example, an RF generator such as the ENI Genesis series which has the capability to "frequency hunt" for the best frequency match with the matching circuit and antenna is suitable.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. A semiconductor processing chamber, comprising:
   a wall;
   an RF signal source;
   a first conductive shield positioned within the chamber to protect at least a portion of the chamber wall from deposition materials, said shield having a slot which defines first and second ends wherein one of said shield ends is electrically coupled to one of said RF signal source and ground; and
   a coil electrically coupled in series with the other end of said shield and the other of said RF signal source and ground.

2. The semiconductor processing chamber of claim 1 wherein the coil surrounds the conductive shield.

3. The semiconductor processing chamber of claim 1 wherein the coil is a helical coil having a plurality of turns.

4. The semiconductor processing chamber of claim 1 wherein the coil and the shield each define a direction of current flow and the coil is coupled in series with the shield so that their respective directions of current flow are the same.

5. A plasma generator for a semiconductor processing chamber having a wall, comprising:
   an RF source; and
   a conductive shield wall positioned within the chamber to protect at least a portion of the chamber wall from deposition materials, said shield having a first terminal electrically coupled to one of said RF source and ground, and a second shield terminal electrically coupled to the other of said RF signal source and ground.

6. The plasma generator of claim 5 further comprising a coil coupled in series with the RF source and the shield wall and surrounding the shield wall.

7. The plasma generator of claim 5 further comprising a capacitor coupled in series with the shield wall and having a predetermined capacitance to series resonate with the inductance of the shield wall to produce an RF ground at the center of the shield wall.

8. A plasma generator for a semiconductor processing chamber having a wall, comprising:
   a conductive shield wall positioned within the chamber to protect at least a portion of the chamber wall from deposition materials;
   an RF source coupled to the shield wall; and
   a coil coupled in series with the RF source and the shield wall and surrounding the shield wall,
   wherein the coil produces magnet field lines and the shield wall has a curvature to match the curvature of the field lines.

9. A method of generating a plasma in a semiconductor processing chamber having a wall, comprising the steps of:
   radiating RF energy into said chamber from a coil; and
   radiating RF energy into said chamber from a conductive shield having first and second terminals wherein one of said shield terminals is electrically coupled to one of an RF signal source and around and the other terminal of said shield is coupled to the other of said RF signal source and ground, and wherein said shield is positioned within said chamber to protect at least a portion of said chamber wall from deposition materials.

10. The method of claim 9 wherein said coil surrounds said conductive shield.

11. The method of claim 9 wherein said coil is a helical coil having a plurality of turns.

12. The method of claim 9 wherein said conductive shield and said coil are coupled to an RF source to provide a current in said shield and a current in said coil, said two currents having the same direction of flow.

13. A method of assembling an RF antenna for semiconductor processing chamber having a wall, comprising the steps of:
   providing a conductive shield within said chamber to protect at least a portion of said chamber wall from deposition materials, said shield having first and second terminals;
   providing a coil within said chamber positioned exterior to said shield; and
   electrically coupling one of said shield terminals to one of an RF signal source and ground and the other terminal of said shield to said coil; and
   electrically coupling the coil to the other of said RF signal source and ground.

14. A method of assembling a plasma generator in a semiconductor processing chamber having a wall, comprising the steps of:
   providing a conductive shield wall within said chamber to protect at least a portion of said chamber wall from deposition materials, said shield having first and second terminals; and
   electrically coupling one of said shield terminals to one of an RF signal source and ground and the other terminal of said shield to the other of said RF signal source and ground.

15. The method of claim 14 further comprising providing a coil surrounding said shield wall and coupled in series with said RF source and said shield wall.

16. The method of claim 14 further comprising coupling a capacitor in series with said shield wall, said capacitor having a predetermined capacitance to series resonate with the inductance of said shield wall to produce an RF ground at the center of said shield wall.

17. A method of assembling a plasma generator in a semiconductor processing chamber having a wall, comprising the steps of:
   providing a conductive shield wall within said chamber to protect at least a portion of said chamber wall from deposition materials;
   coupling an RF source to aid shield wall; and
   providing a coil surrounding said shield wall and coupled in series with said RF source and said shield wall;
   wherein said shield wall has a curvature in said shield wall matching the curvature of magnetic field lines produced by said coil.

18. A plasma generator for a semiconductor processing chamber having a wall, an RF signal source and electrical ground, comprising:

a first conductive shield positioned within the chamber to protect at least a portion of the chamber wall from deposition materials, said shield having first and second terminals wherein one of said shield terminals is electrically coupled to one of said RF signal source and ground; and a coil electrically coupled in series with the other terminal of said shield and the other of said RF signal source and ground.

19. The semiconductor processing chamber of claim 18 wherein the coil surrounds the conductive shield.

20. The semiconductor processing chamber of claim 18 wherein the coil is a helical coil having a plurality of turns.

21. The semiconductor processing chamber of claim 19 wherein the coil and the shield each define a direction of current flow and the coil is coupled in series with the shield so that their respective directions of current flow are the same.

22. A plasma generator for a semiconductor processing chamber having a wall, an RF signal source and electrical ground, comprising:

a conductive first shield wall positioned within the chamber to protect at least a portion of the chamber wall from deposition materials, said shield having first and second terminals and a slot which electrically insulates said first and second terminals from each other wherein one of said terminals is electrically coupled to said RF signal source and the other terminal is electrically coupled to said ground; and a second shield wall electrically insulated from said first shield wall and positioned adjacent said slot to protect the portion of the chamber wall adjacent said slot.

23. A method of generating a plasma in a semiconductor processing chamber having a wall, comprising the steps of:

radiating RF energy into said chamber from a conductive shield positioned within said chamber to protect at least a portion of said chamber wall from deposition materials; and radiating RF energy into said chamber from a coil coupled in series with the RF source and the shield wall and surrounding the shield wall, wherein the coil produces magnet field lines and the shield wall has a curvature to match the curvature of the field lines.

24. The plasma generator of claim 1 wherein said conductive shield wall defines a multiple turn coil.

25. The method of claim 9 wherein said conductive shield wall defines a multiple turn coil.

* * * * *